(12) United States Patent
Park

(10) Patent No.: US 10,283,174 B2
(45) Date of Patent: May 7, 2019

(54) MEMORY SYSTEM INITIALIZING PAGE BUFFERS AND OPERATING METHOD THEREOF

(71) Applicant: SK hynix Inc., Gyeonggi-do (KR)

(72) Inventor: Yong Soon Park, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 15 days.

(21) Appl. No.: 15/060,103

(22) Filed: Mar. 3, 2016

(65) Prior Publication Data

US 2017/0092339 A1    Mar. 30, 2017

(30) Foreign Application Priority Data

Sep. 24, 2015   (KR) .................. 10-2015-0135859

(51) Int. Cl.
*G11C 7/10*   (2006.01)
(52) U.S. Cl.
CPC .......... *G11C 7/1048* (2013.01); *G11C 7/1006* (2013.01); *G11C 7/1057* (2013.01); *G11C 7/1072* (2013.01)
(58) Field of Classification Search
CPC ... G11C 7/1048; G11C 7/1057; G11C 7/1006; G11C 7/1072
See application file for complete search history.

(56) References Cited

U.S. PATENT DOCUMENTS

| | | | | |
|---|---|---|---|---|
| 2004/0205418 A1* | 10/2004 | Sakaue | ............... | G06F 11/1068 714/52 |
| 2004/0221092 A1* | 11/2004 | Lee | ...................... | G11C 16/105 711/103 |
| 2010/0014365 A1* | 1/2010 | Cho | ..................... | G11C 7/1066 365/193 |
| 2011/0235426 A1* | 9/2011 | Oh | .......................... | G11C 7/10 365/185.18 |
| 2014/0313831 A1* | 10/2014 | Kim | ...................... | G11C 16/06 365/185.12 |

FOREIGN PATENT DOCUMENTS

KR    1020020089992    11/2002

* cited by examiner

*Primary Examiner* — Jerome Leboeuf
(74) *Attorney, Agent, or Firm* — IP & T Group LLP

(57) ABSTRACT

A memory system includes a memory device for storing data, and a controller for controlling the memory device by outputting control signals to the memory device. In the memory device, when an address of a selected operation is received in response to the control signals, the memory device simultaneously initializes a page buffer included in the memory device.

19 Claims, 7 Drawing Sheets

MEMORY SYSTEM INITIALIZING PAGE BUFFERS AND OPERATING METHOD THEREOF

CROSS-REFERENCE TO RELATED APPLICATION

The present application claims priority to Korean patent application number 10-2015-0135859 filed on Sep. 24, 2015, in the Korean Intellectual Property Office, the entire disclosure of which is incorporated by reference herein.

BACKGROUND

1. Field

The present disclosure relates generally to semiconductor technology and more particularly to a memory system and a method of operating thereof.

2. Description of the Related Art

A memory system is widely used as a data storage device of digital devices such as computers, digital cameras, MP3 players, and smart phone. The memory system may include a memory device for storing data and a controller for controlling the memory device. The controller may transmit commands and data between a host such as a digital device and the memory device.

The memory device may include a memory cell array for storing data, a peripheral circuit suitable for program data in the memory cell array or read or erase data stored from the memory cell array, and a control logic for controlling the peripheral circuit. The peripheral circuit may include a voltage generation circuit, a row decoder, a page buffer unit, a column decoder, and an input/output circuit. The page buffer unit temporarily stores data in the program or read operation, and transmits/receives data to/from the memory cell array.

SUMMARY

Embodiments of the present disclosure are directed to a memory system and an operating method thereof, which perform an initialization operation of a page buffer unit.

Embodiments of the present disclosure provides a memory system and an operating method thereof, which can reduce the time required to perform an initialization operation of a page buffer unit.

Embodiments of the present disclosure provides a memory system and an operating method thereof, which can reduce the time required to perform an initialization operation of a page buffer unit, and prevent peak current from being increased.

According to an aspect of the present disclosure, there is provided a memory system including: a memory device including a page buffer, suitable for store data; and a controller suitable for control the memory device by outputting control signals to the memory device, wherein, when an address for a selected operation is received in response to the control signals, the memory device simultaneously initializes the page buffer.

According to an aspect of the present disclosure, there is provided a method of operating a memory system, the method including: sequentially loading, into a memory device, an address input command, a plurality of addresses, and an address input completion command, in response to a write enable signal; and initializing a page buffer included in the memory device while the addresses are being loaded.

BRIEF DESCRIPTION OF THE DRAWINGS

Example embodiments of the invention will now be described with reference to the accompanying drawings. However it is noted, that the invention may be embodied in different forms and should not be construed as being limited to the embodiments set forth herein. Rather, these embodiments are provided so that this disclosure will be thorough and complete to those skilled in the art to which this invention pertains.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, exemplary embodiments of the present disclosure will be described in detail with reference to the accompanying drawings. However, the present disclosure is not limited to the embodiments but may be implemented into different forms. These embodiments are provided only for illustrative purposes and for full understanding of the scope of the present disclosure by those skilled in the art.

Figure 1:
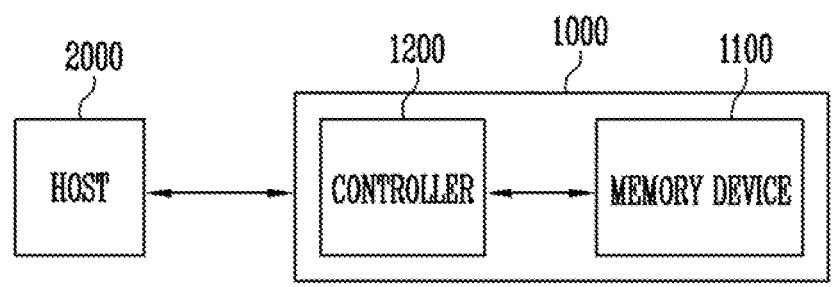
FIG. 1 is a diagram illustrating a memory system, according to an embodiment of the present disclosure.

FIG. 1 is a diagram illustrating a memory system according to an embodiment of the present disclosure.

Referring to FIG. 1, the memory system 1000 may include a memory device 1100 for storing data and a controller 1200 for controlling the memory device 1100.

The memory device 1100 may include a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), a flash memory and the like. In the following embodiment, the memory device 1100 implemented as a NAND flash memory will be described as an example.

The controller 1200 may control overall operations of the memory device 1100, and may output a command for controlling the memory device 1100 and an address in response to a command received from a host 2000, or input/output data.

The host 2000 may communicate with the memory system 1000 by using an interface protocol such as peripheral component interconnect-express (PCI-E), advanced technology attachment (ATA), serial ATA (SATA), parallel ATA (PATA), serial attached SCSI (SAS), and the like.

Figure 2:
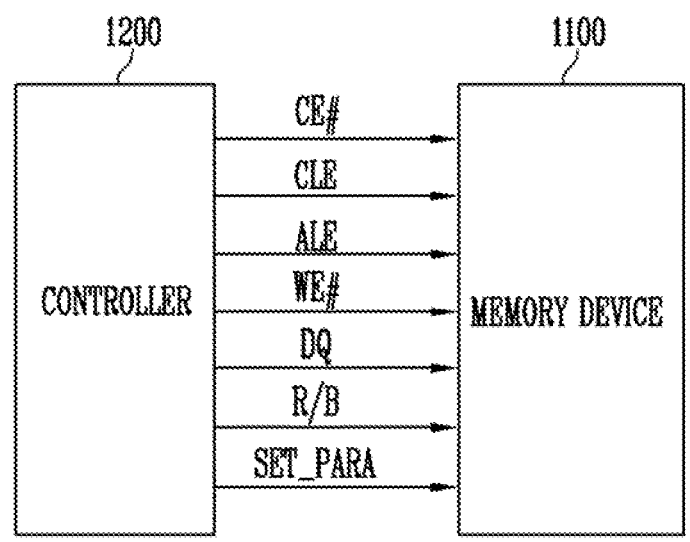
FIG. 2 is a diagram illustrating connections between a controller and a memory device, according to an embodiment of the present disclosure.

FIG. 2 is a diagram illustrating connections between a controller and a memory device according to an embodiment of the present disclosure. For example, the controller and the memory device of FIG. 2 may be the controller 1200 and the memory device 1100 of FIG. 1, respectively.

Referring to FIG. 2, the controller 1200 may output a plurality of control signals CE#, CLE, ALE, WE#, R/B and SET_PARA for controlling the memory device 1100 in response to a command (not shown) received from a host (e.g., the host 2000 of FIG. 1), and may output commands, addresses, and data through an input/output terminal DQA chip enable signal CE# may be used to allow the memory device 1100 to enter into a predetermined mode (e.g., a standby mode).

A command latch enable signal CLE may be used when a command is loaded into the memory device 1100. For example, in a read operation of the memory device 1100, if the command latch enable signal CLE is high, a read command loaded to the input/output terminal DQ may be loaded into the memory device 1100. If the command latch enable signal CLE is low, the read command may not be loaded into the memory device 1100 even when the read command is loaded to the input/output terminal DQ.

An address latch enable signal ALE may be used when an address is loaded into the memory device 1100. For example, if the address latch enable signal ALE is high, an address loaded to the input/output terminal DQ may be loaded into the memory device 1100. If the address latch enable signal ALE is low, the address may not be loaded into the memory device 1100 even when the address is applied to the input/output terminal DQ.

A write enable signal WE# may be used for data or command input. For example, when the write enable signal WE# is at a rising edge where the level of the write enable signal WE# is changed from low to high, a command, address, or data loaded to the input/output terminal DQ may be loaded in the memory device 1100.

A read/busy signal R/B may provide an indication that the memory device 1100 is performing a substantial operation. For example, the read/busy signal R/B may become low when the memory device 1100 is under operation in response to a command, and may become high when the memory device 1100 is not under operation.

A set parameter SET_PARA may be used when a page buffer unit (e.g., 23 of FIG. 3) included in the memory device 1100 is initialized.

In addition to the above-described signals, the controller 1200 may transmit a plurality of control signals to the memory device 1100. However, this is not directly related to this embodiment, and therefore, its description will be omitted.

Figure 3:
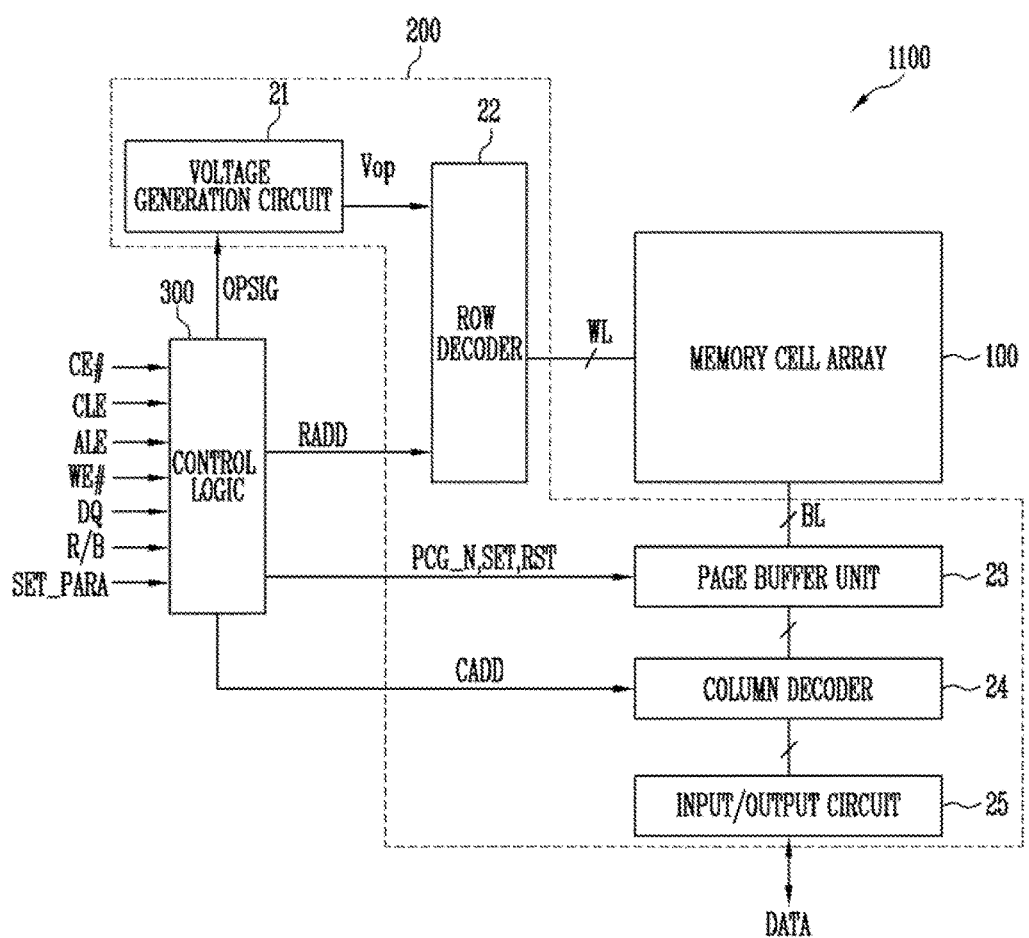
FIG. 3 is a diagram illustrating a memory device, according to an embodiment of the present disclosure.

FIG. 3 is a diagram illustrating a memory device according to an embodiment of the present disclosure. For example, the memory device of FIG. 3 may be the memory device 1100 of FIGS. 1 and 2.

Referring to FIG. 3, the memory device 1100 may include a memory cell array 100 for storing data, a peripheral circuit 200 suitable for performing program, read, and erase operations of the memory cell array 100, and a control logic 300 suitable for controlling the peripheral circuit 200.

The memory cell array 100 may include a plurality of memory blocks (not shown). The memory blocks may include a plurality of cell strings (not shown). For example, the cell strings may include source select transistors, memory cells, and drain select transistors, which are connected in series to each other between a source line and bit lines BL. Gates of source select transistors included in different cell strings may be connected to source select lines, and gates of memory cells included in different cell strings may be connected to word lines WL. Gates of drain select transistors included in different cell strings may be connected to the drain select lines.

The peripheral circuit 200 may include a voltage generation circuit 21, a row decoder 22, a page buffer unit 23, a column decoder 24, and an input/output circuit 25.

The voltage generation circuit 21 may generate various voltages Vop necessary for various operations in response to an operation signal OPSIG. For example, the voltage generation circuit 21 may generate a read voltage for a read operation, a program voltage necessary for a program operation, and an erase voltage necessary for an erase operation, and generate pass voltages having various levels necessary for the respective operations. In addition, the voltage generation circuit 21 may generate turn-on voltages for turning on the source select transistors and the drain select transistors.

The row decoder 22, in response to a row address RADD, may transmit the voltages Vop generated by the voltage generation circuit 21 to various lines including the word lines WL connected to a selected memory block among the memory blocks included in the memory cell array 100.

The page buffer unit 23 may temporarily store data or be initialized in response to control signals output from the control logic 300. For example, the page buffer unit 23 may be initialized in response to a precharge signal PCG_N and a setup signal SET or reset signal RST, which are output from the control logic 300.

The column decoder 24 may transmit/receive data to/from the page buffer unit 23 or the input/output circuit 25 in response to a column address CADD.

The input/output circuit 25 may transmit data received from the outside (e.g., the controller 1200 of FIG. 2) to the column decoder 24, or transmits data DATA received from the column decoder 24 to the outside (e.g., the controller 1200 of FIG. 2).

The control logic 300 may output at least one of an operation signal OPSIG, a row address RADD, a precharge signal PCG_N, a setup signal SET or reset signal RST, and a column address CADD in response to at least one of a chip enable signal CE#, a command latch enable signal CLE, an address latch enable signal ALE, a write enable signal WE#, a ready/busy signal R/B, and a set parameter SET_PARA, which are output from the controller (1200 of FIG. 2), and a command and an address, which are received through the input/output terminal DQ. If the set parameter SET_PARA is received, the control logic 300 may output the precharge signal PCG_N and the setup signal SET or reset signal RST, which are used to initialize the page buffer unit 23 while an address for the program or read operation is being received. The page buffer unit 23 may be initialized in response to the precharge signal PCG_N and the setup signal SET or reset signal RST.

In the above-described embodiment, the chip enable signal CE#, the command latch enable signal CLE, the address latch enable signal ALE, the write enable signal WE#, the read/busy signal R/B, the set parameter SET_PARA, the command, and the address, all of which are output from the controller (1200 of FIG. 2), are applied to the control logic 300, but may be applied to the control logic 300 through the input/output circuit 25, according to another embodiment of the memory device 1100.

Figure 4:
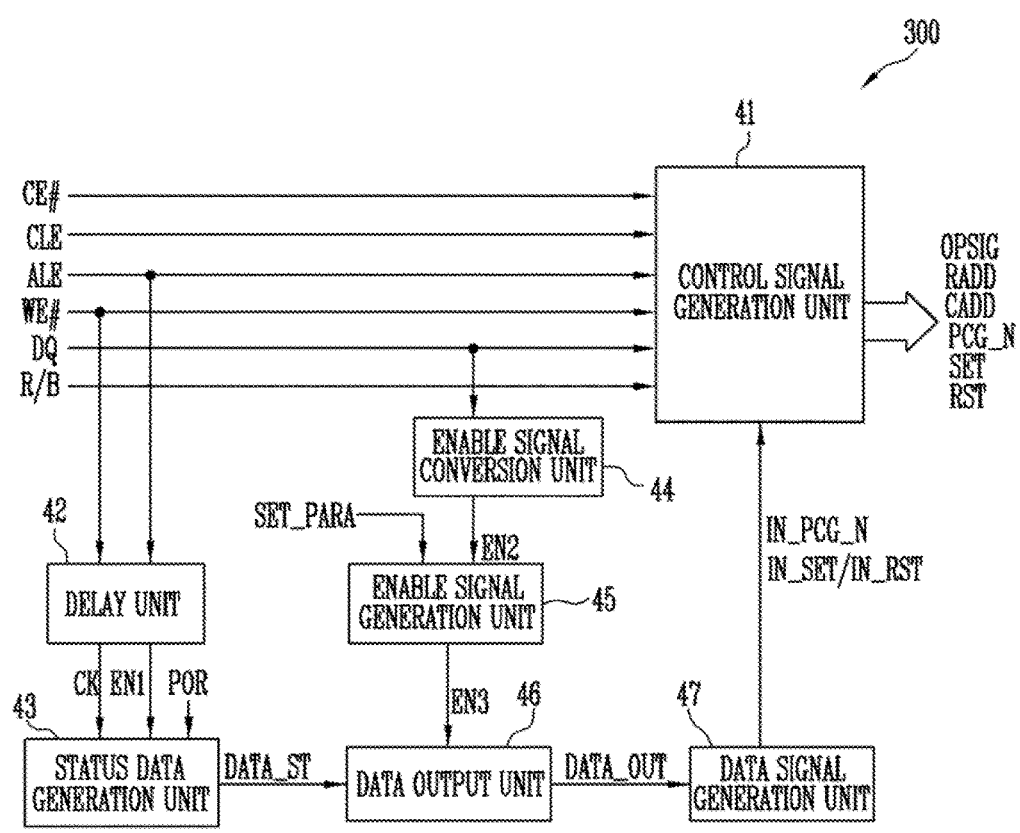
FIG. 4 is a diagram illustrating a control logic according to an embodiment of the present disclosure.

FIG. 4 is a diagram illustrating a control logic, according to an embodiment of the present disclosure. For example, the control logic of FIG. 4 may be the control logic 300 of FIG. 3.

Referring to FIG. 4, the control logic 300 may include a control signal generation unit 41, a delay unit 42, a status data generation unit 43, an enable signal conversion unit 44, an enable signal generation unit 45, a data output unit 46, and a data signal generation unit 47.

The control signal generation unit 41 may output at least one of an operation signal OPSIG, a row address RADD, a column address CADD, a precharge signal PCG_N, a setup signal SET or reset signal RST in response to at least one of a chip enable signal CE#, a command latch enable signal CLE, an address latch enable signal ALE, a write enable signal WE#, a ready/busy signal R/B, a set parameter SET_PARA, a command and an address, which are received through the input/output terminal DQ, a precharge generation signal IN_PCG_N and a setup generation signal IN_SET or reset generation signal IN_RST, which are generated by the data signal generation unit 47.

The delay unit 42 may generate at least one of a setup clock CK and a first enable signal EN1 in response to at least one of the write enable signal WE# and the address latch enable signal ALE. For example, if the write enable signal WE# is received, the delay unit 42 may delay the setup clock CK having the same period as the write enable signal WE# for a predetermined time and may output the delayed setup clock CK. Also, if the address latch enable signal ALE is received, the delay unit 42 delays the first enable signal EN1 having the same period as the address latch enable signal ALE for a predetermined time and may output the delayed first enable signal EN1.

The status data generation unit 43 may store a plurality of status data DATA_ST, and sequentially may output the status data DATA_ST in response to at least one of a power-up signal POR, the setup clock CK, and the first enable signal EN1. In some embodiments, the power-up signal POR may be set to a high level. The status data generation unit 43 may sequentially output status data DATA_ST selected from the plurality of stored status data DATA_ST in response to at least one of the power-up signal POR, the setup clock CK and the first enable signal EN1. For example, when status data DATA_ST having values of 101, 001, 010, 011, and 100 are stored in the status data generation unit 43, and both the power-up signal POR and the first enable signal EN1 are high, the status data DATA_ST may be sequentially outputted whenever the level of the setup clock CK is changed from low to high.

The enable signal conversion unit 44 may output a second enable signal EN2 in response to a command applied to the input/output terminal DQ. For example, the enable signal conversion unit 44 may output the second enable signal EN2 having a level changed to high or low in response to a command loaded to the input/output terminal DQ.

The enable signal generation unit 45 may generate a third enable signal EN3 in response to the set parameter SET_PARA and the second enable signal EN2. For example, if the second enable signal EN2 is applied in a state in which the set parameter SET_PARA is applied, the enable signal generation unit 45 may output the third enable signal EN3 in synchronization with the second enable signal EN2.

The data output unit 46 may output control data DATA_OUT in response to the status data DATA_ST and the third enable signal EN3. For example, the data output unit 46 may generate control data DATA_OUT by decoding the status data DATA_ST and the third enable signal EN3, and output the generated control data DATA_OUT. Thus, the data output unit 46 can output variable control data DATA_OUT in response to the status data DATA_ST and the third enable signal EN3.

The data signal generation unit 47 generates at least one of a precharge generation signal IN_PCG_N and a setup generation signal IN_SET or reset generation signal IN_RST in response to the control data DATA_OUT. For example, if first control data DATA_OUT is received, the data signal generation unit 47 may output the precharge generation signal IN_PCG_N after a predetermined time is delayed. Subsequently, if set control data DATA_OUT is received, the data signal generation unit 47 may output only one signal out of the setup generation signal IN_SET and the reset generation signal IN_RST. Which signal to output out of the setup and the reset generation signals IN_SET, IN_RST may be changed based on a setting of the data signal generation unit 47, or may be arbitrarily set when the memory device 1100 is manufactured. For example, when the setup signal SET is used to initialize the page buffer unit (23 of FIG. 3), the data signal generation unit 47 may be set to output the setup generation signal IN_SET instead of the reset generation signal IN_RST. Alternatively, when the reset signal RST is used to initialize the page buffer unit (23 of FIG. 3), the data signal generation unit 47 may be set to output the reset generation signal IN_RST instead of the setup generation signal IN_SET. To this end, the data signal generation unit 47 may be configured with a plurality of SR latches operating in response to the control data DATA_OUT. The connection configuration of the SR latches may be variously implemented. As described above, if the set control data DATA_OUT is received, the data signal generation unit 47 may output the setup generation signal IN_SET or reset generation signal IN_RST. If the set control data DATA_OUT is not received, the data signal generation unit 47 does not output the setup generation signal IN_SET or reset generation signal IN_RST.

Figure 5:
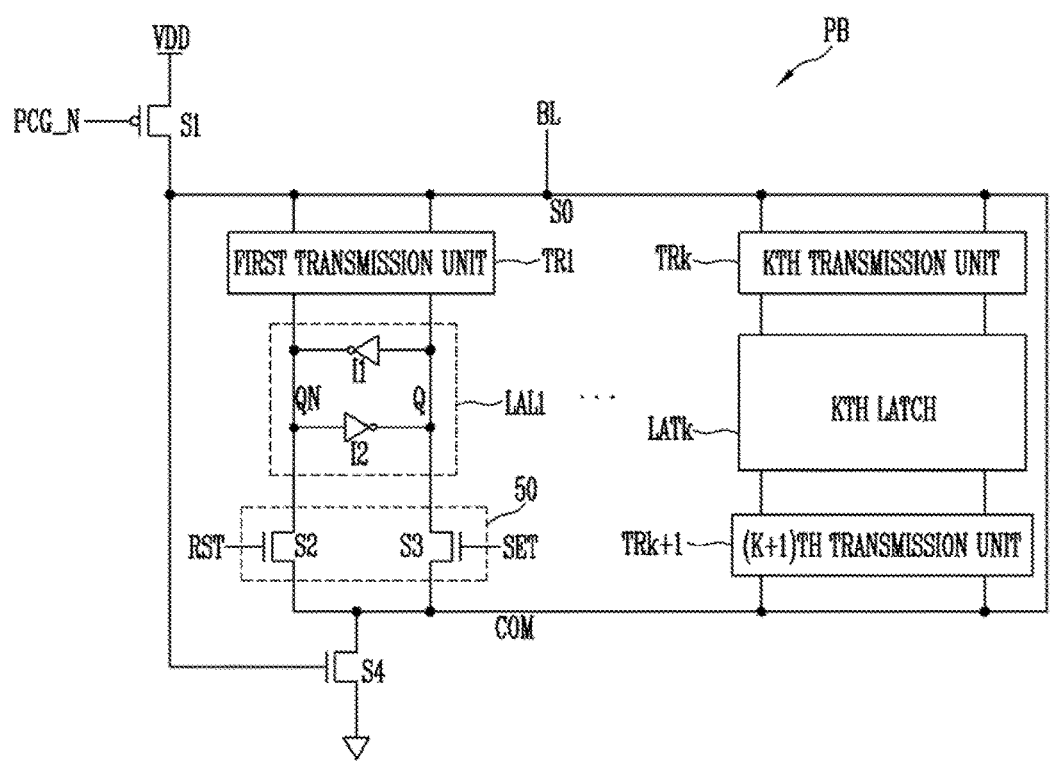
FIG. 5 is a diagram illustrating any one page buffer included in a page buffer unit, according to an embodiment of the present disclosure.

FIG. 5 is a diagram illustrating any one page buffer included in a page buffer unit, according to an embodiment of the present disclosure. For example, the page buffer of FIG. 5 may be any one page buffer included in the page buffer unit 23 of FIG. 3. The page buffer unit 23 may include a plurality of page buffers configured identically to each other. In FIG. 5, any one page buffer PB among the plurality of page buffers will be described as an example.

Referring to FIG. 5, the buffer page PB is connected to a memory cell array (e.g. the memory cell array 100 of FIG. 3) through a bit line BL. The page buffer PB may include first to kth latches LAT1 to LATk (where k is a positive integer) for storing data temporarily. The first to kth latches LAT1 to LATk may be connected in parallel between a sensing node SO and a common sensing node COM. The page buffer PB may also include a precharge switch S1 for precharging the sensing node SO, and a discharge switch S4 for discharging the common sensing node COM. The precharge switch S1 may be implemented with a PMOS transistor capable of precharging the sensing node SO by transmitting a power voltage VDD to the sensing node SO in response to a precharge signal PCG_N. The discharge switch S4 may be implemented with an NMOS transistor capable of discharging the common sensing node COM according to a potential of the sensing node SO. The first to kth latches LAT1 to LATk may be configured identically to each other, and therefore, the first latch LAT1 will be described as an example. The first latch LAT1 includes a first inverter I1 and a second inverter I2. An input terminal of the first inverter I1 is connected to the first node Q, and an output terminal of the first inverter I1 is connected to a second node QN. An input terminal of the second inverter I2 is connected to the second node QN, and an output terminal of the second inverter I2 is connected to the first node Q.

Also, the page buffer PB may include first to (k+1)th transmission units TR1 to TRk+1 (where k is a positive integer) suitable for initialize the first to kth latches LAT1 to LATk, transmit data stored in the first to kth latches LAT1 to LATk to the sensing node SO or the common sensing node COM, or transmit data loaded to the sensing node SO or the common sensing node COM to the first to (k+1)th latches LAT1 to LATk+1. For example, when the first latch LAT1 is a main latch, a transmission unit connected between the first latch LAT1 and the common sensing node COM may be used as an initialization circuit 50, and the other first to (k+1)th transmission units TR1 to TRk+1 may be used as data transmission units.

The initialization circuit 50 may be connected between the first latch LAT1 and the common sensing node COM. The initialization circuit 50 may include a switch S2 as a reset switch and a switch S3 as a setup switch. The reset switch S2 may be implemented with an NMOS transistor capable of connecting the second node QN and the common sensing node COM to each other in response to a reset signal RST. The setup switch S3 may be implemented as an NMOS transistor capable of connecting the first node Q and the common sensing node COM to each other in response to a setup signal SET. In this case, the initialization circuit 50 may be connected to the first latch LAT1. In a different way, some transmission units among the first to (k+1)th transmission units TR1 to TRk+1 connected to the first to kth latches LAT1 to LATk may be used as an initialization circuit. If the precharge signal PCG_N becomes low, and the reset signal RST or setup signal SET becomes high, the latch connected to the initialization circuit is initialized.

Figure 6:
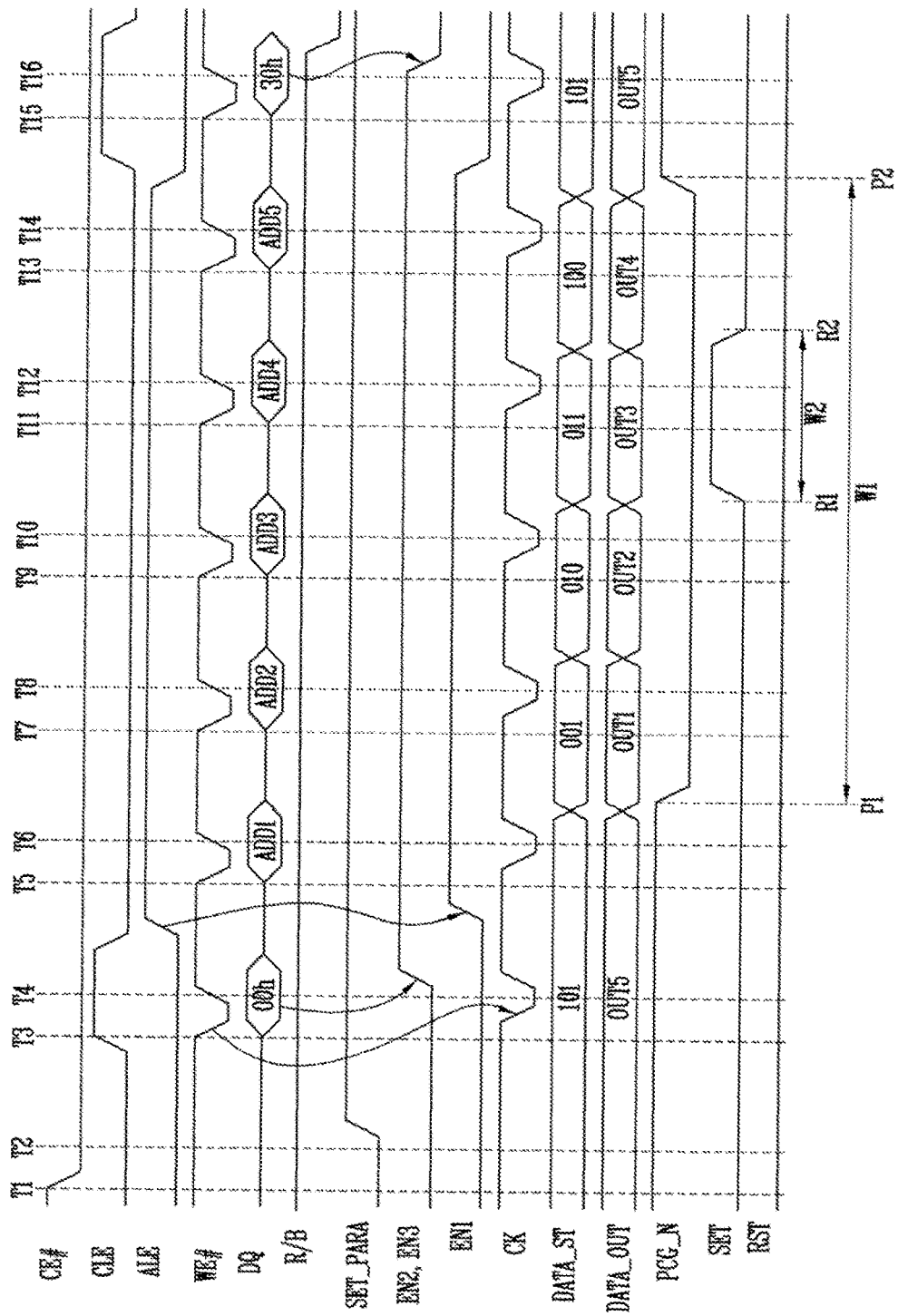
FIG. 6 is a timing diagram illustrating an operation of a memory device, according to an embodiment of the present disclosure.

FIG. 6 is a timing diagram illustrating an operation of a memory device, according to an embodiment of the present disclosure. For example, the operation may be performed by the memory device 1100 and the controller 1200 of FIG. 2 to FIG. 5.

Referring to FIG. 6, an initialization operation of a page buffer (e.g., PB of FIG. 5) according to the embodiment of the present disclosure is simultaneously performed in command and address transmission sections for performing a program, read, or erase operation. The initialization operation of the page buffer (e.g., PB of FIG. 5) will be described in detail by exemplifying the read operation.

If the read operation is started, a low chip enable signal CE# may be outputted to the memory device 1100 of FIG. 2 selected to perform the read operation (T1). If the low chip enable signal CE# is applied to the selected memory device 1100 of FIG. 2, a signal and data, loaded to a channel, may be loaded to only the selected memory device. That is, a high chip enable signal CE# may be applied to the remaining memory devices other than the selected memory device 1100 among a plurality of memory devices connected to the controller 1200 through the channel. Therefore, although the signal and data are loaded to the channel, the signal and data may not be loaded to the other memory devices.

Subsequently, the controller 1200 may output a high set parameter SET_PARA (T2). If the high set parameter SET_PARA is loaded, the mode of the selected memory device 1100 may become an initialization mode. An initialization mode means a mode in which the page buffer can be initialized simultaneously with the loading of a command and an address to the memory device 1100.

The controller 1200 may become ready to load a command to the selected memory device 1100 by changing the level of a low command latch enable signal CLE to high (T3), and loading an address input command 00h to the input/output terminal DQ. The controller 120 may output a write enable signal WE# as a clock having a predetermined period such that the address input command 00h loaded to the input/output terminal DQ may be loaded to the selected memory device 1100. The address input command 00h may be inputted to the selected memory device 1100 at a rising edge (T4) of the write enable signal WE# output in the form of a clock.

If the write enable signal WE# is outputted from the controller 1200, the delay unit 42 of FIG. 4 may output a setup clock CK obtained by delaying the write enable signal WE# for a predetermined time. If the address input command 00h is loaded to the input/output terminal DQ, the enable signal conversion unit 44 of FIG. 4 may output a second enable signal EN2.

Since the set parameter SET_PARA may be set to high level, if the second enable signal EN2 is output to be high, the enable signal generation unit 45 of FIG. 4 may output a third enable signal EN3 to be high in synchronization with the second enable signal EN2.

Subsequently, the controller 1200 may output a high address latch enable signal ALE so as to load addresses ADD1 to ADD5. If the address latch enable signal ALE is output to be high, the delay unit 42 of FIG. 4 may output a first enable signal EN1 to be high after the address latch enable signal ALE is delayed for a predetermined time.

If the controller 1200 loads a first address ADD1 to the input/output terminal DQ (T5), the first address ADD1 may be inputted to the selected memory device 1100 at a rising edge (T6) of the write enable signal WE#. If the controller 1200 loads a second address ADD2 to the input/output terminal DQ (T7), the second address ADD2 may be inputted to the selected memory device 1100 at a rising edge (T8) of the write enable signal WE#. If the controller 1200 loads a third address ADD3 to the input/output terminal DQ (T9), the third address ADD3 may be inputted to the selected memory device 1100 at a rising edge (T10) of the write enable signal WE#. If the controller 1200 loads a fourth address ADD4 to the input/output terminal DQ (T11), the fourth address ADD4 may be inputted to the selected memory device 1100 at a rising edge (T12) of the write enable signal WE#. If the controller 1200 loads a fifth address ADD5 to the input/output terminal DQ (T13), the fifth address ADD5 may be inputted to the selected memory device 1100 at a rising edge (T14) of the write enable signal WE#. In FIG. 6, the first to fifth addresses ADD1 to ADD5 are illustrated. However, this corresponds to an embodiment for helping understanding of the present disclosure, and therefore, the kind and number of addresses may be changed depending, for example, on the memory system used.

If the first to fifth addresses ADD1 to ADD5 are all inputted to the selected memory device 1100, the controller 1200 may load an address input completion command 30h to the input/output terminal DQ (T15). The address input completion command 30h may be inputted to the selected memory device 1100 at a rising edge (T16) of the write enable signal WE#.

While the first to fifth addresses ADD1 to ADD5 are being inputted to the selected memory device 1100, the setup clock CK is clocked in the same period as the write enable signal WE#. Therefore, the status data generation unit 43 of FIG. 4 sequentially may output status data DATA_ST stored therein. For example, when 101 is set as first status data DATA_ST, the status data DATA_ST is not changed even at the rising edge (T4) of the setup clock CK before the first enable signal EN1 is output.

If the status data generation unit 43 may output the status data DATA_ST in response to the first enable signal EN1 and the setup clock CK, the data output unit 46 may output control data DATA_OUT by decoding the status data DATA_ST and the third enable signal EN3. Thus, the control data DATA_OUT may be outputted as different data according to the status data DATA_ST and the third enable signal EN3. For example, the control data DATA_OUT output when the status data DATA_ST is 101 may be defined as OUT5, the control data DATA_OUT output when the status data DATA_ST is 011 may be defined as OUT3, and the control data DATA_OUT output when the status data DATA_ST is 100 may be defined as OUT4.

If first control data DATA_OUT is received, the data signal generation unit 47 may output a precharge generation signal IN_PCG_N to be low after the first control data DATA_OUT is delayed for a predetermined time (P1). If the last control data DATA_OUT is received, the data signal generation unit 47 may output the precharge generation signal IN_PCG_N to be high after the last control data DATA_OUT is delayed for a predetermined time (P2). The control signal generation unit 41 may output a precharge signal PCG_N in synchronization with the precharge generation signal IN_PCG_N (P1-P2).

If set control data DATA_OUT is received while the precharge signal PCG_N is output to be high, the data signal generation unit 47 may output a setup generation signal IN_SET or reset generation signal IN_RST to be high (R1). If next control data DATA_OUT of the set control data DATA_OUT is received, the data signal generation unit 47 may change the level of the setup generation signal IN_SET or reset generation signal IN_RST to the level of low (R2). The control signal generation unit 41 may output a setup signal SET or reset signal RST in synchronization with the setup generation signal IN_SET or reset generation signal IN_RST (R1~R2). When the high reset signal RST is set to be outputted, the setup signal SET may maintain the level of low.

While the setup signal SET or reset signal RST output is high, the page buffer PB may be initialized. For example, if the precharge signal PCG_N is low, the precharge switch S1 of the page buffer PB may be turned on, and therefore, the sensing node SO may be precharged with a positive voltage. If the sensing node SO is precharged with the positive voltage, the discharge switch S4 is turned on, and therefore, the common sensing node COM is connected to a ground terminal. Both the setup signal SET and the reset signal RST may be maintained to be low until the common sensing node COM is grounded. Subsequently, if the level of the setup signal SET is changed to the level of high, the setup switch S3 may be turned on, so that the first node Q of the first latch LAT1 may be initialized to be low and the second node QN of the first latch LAT1 may be initialized to be high. If the level of the reset signal RST is changed to the level of high, the reset switch S2 may be turned on, so that the second node QN of the first latch LAT1 may be initialized to be low and the first node Q of the first latch LAT1 may be initialized to be high.

As described above, the initialization operation of the page buffer PB of FIG. 5 is performed within a period where the addresses ADD1 to ADD5 are inputted, and thus the operation time of the page buffer PB can be reduced by the time required to initialize the page buffer PB in the read operation of the memory system. When the read operation is successively performed, the page buffer PB may be also initialized during a period where addresses are input by read commands, respectively. Thus, the operation time of the page buffer PB can be reduced even in a successive read operation. Particularly, the initialization operation of the page buffer PB is separated from the read operation of the page buffer PB, so that the current consumption amount of the page buffer PB can be reduced. Accordingly, it is possible to prevent peak current of the page buffer PB from being increased. Thus, it is possible to improve the reliability of the memory system 1000 of FIG. 1.

Figure 7:
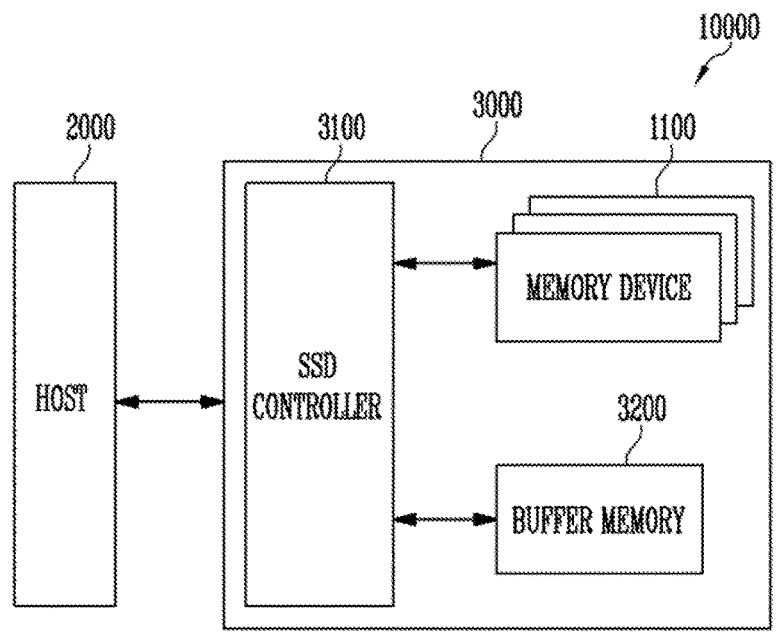
FIG. 7 is a diagram illustrating a system having a solid state drive including a memory device, according to an embodiment of the present disclosure.

FIG. 7 is a diagram illustrating a system 10000 having a solid state drive (SSD) including a memory device according to an embodiment of the present disclosure. For example, the memory device of FIG. 7 may be the memory device 1100 of FIG. 1.

Referring to FIG. 7, the system 10000 includes a host 2000 and an SSD 3000.

The SSD 3000 may include an SSD controller 3100, a buffer memory 3200, and a memory device 1100.

The memory device 1100 may be configured substantially identically to that of FIG. 3, and therefore, detailed description of the memory device 1100 will be omitted.

The SSD controller 3100 may provide a physical connection with the host 2000 and the SSD 3000. For example, the SSD controller 3100 may provide interfacing with SSD 3000, corresponding to a bus format of the host 2000. Particularly, the SSD controller 3100 may decode commands provided from the host 2000. According to the decoded result, the SSD controller 3100 may access the memory device 1100. The bus format of the host 2000 may include a universal serial bus (USB), a small computer system interface (SCSI), a peripheral component interconnect (PCI) express, advance technology attachment (ATA), parallel ATA (PATA), serial ATA (SATA), a serial attached SCSI (SAS), and the like.

The buffer memory 3200 may temporarily store program data provided from the host 2000 or data read from the memory device 1100. When data existing in the memory device 1100 is cached in a read request of the host 2000, the buffer memory 3200 supports a cache function of directly providing the cached data to the host 2000. In general, when the data transmission speed through the bus format (e.g., SATA or SAS) of the host 2000 is faster than the data transmission speed through a memory channel of the SSD 3000, a large-capacity buffer memory 3200 may be provided, so that it is possible to minimize the performance reduction caused by a difference in speed. The buffer memory 3200 may be provided as a synchronous DRAM so as to provide sufficient buffering in the SSD 3000 used as a large-capacity auxiliary memory device.

The memory device 1100 may be employed as a storage medium of the SSD 3000. For example, the memory device 1100 may be provided as a nonvolatile memory device having a large-capacity storage ability as described in FIG. 1. The memory device 1100 may be provided as a NAND-type flash memory in the nonvolatile memory device.

Figure 8:
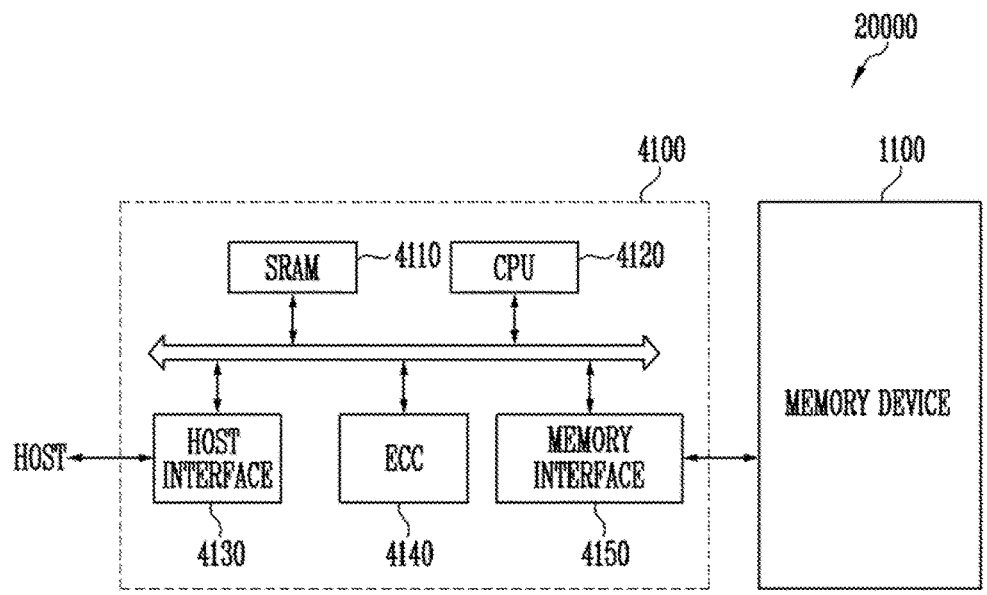
FIG. 8 is a diagram illustrating a memory system including a memory device, according to an embodiment of the present disclosure.

FIG. 8 is a diagram illustrating a memory system 20000 including a memory device according to an embodiment of the present disclosure. For example, the memory device of FIG. 8 may be the memory device 1100 of FIG. 1.

Referring to FIG. 8, the memory system 20000 may include a controller 4100 and a memory device 1100.

The memory device 1100 may be configured substantially identically to that of the FIG. 3, and therefore, detailed description of the memory device 1100 will be omitted.

The controller 4100 may be suitable for control the memory device 1100. A static random access memory (SRAM) 4110 may be used as a working memory of a central processing unit (CPU) 4120. A host interface 4130 may be provided with a data exchange protocol of a host connected to the memory system 20000. An error correction code (ECC) module 4140 that is an error correction circuit provided in the controller 4100 may detect and correct errors included in data read out from the memory device 1100. A memory interface 4150 may interface with the memory device 1100. The CPU 4120 may perform a control operation for data exchange of the controller 4100. Although not shown in FIG. 8, the memory system 20000 may further include a read only memory (ROM) (not shown) for storing code data for interfacing with the host.

The memory system 20000 may be applied to a computer, a ultra mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 9:
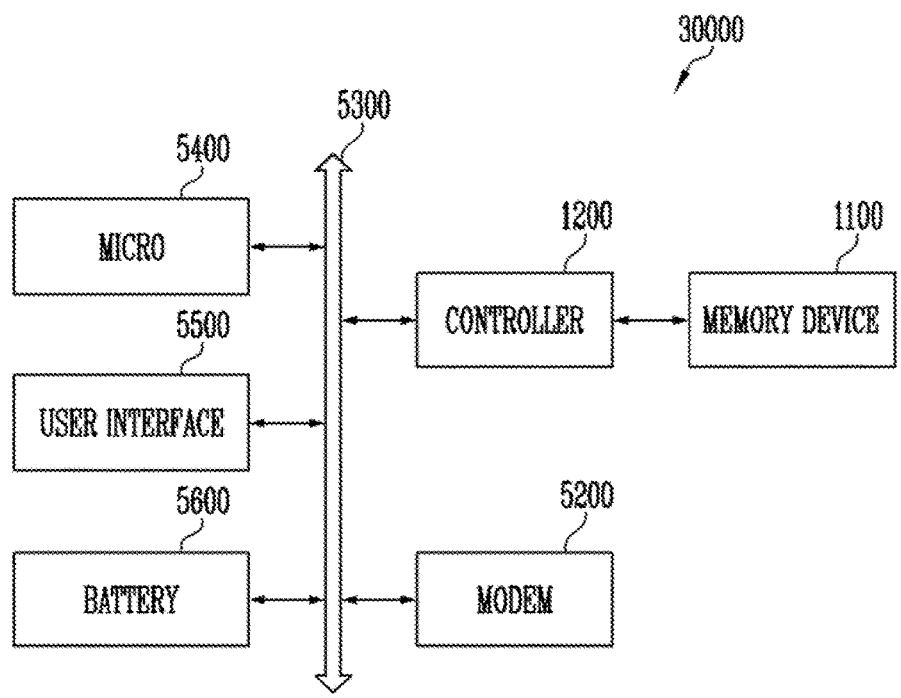
FIG. 9 is a diagram illustrating a computing system including a memory device, according to an embodiment of the present disclosure.

FIG. 9 is a diagram illustrating a computing system 30000 including a memory device according to an embodiment of the present disclosure. For example, the memory device of FIG. 9 may be the memory device 1100 of FIG. 1.

Referring to FIG. 9, the computing system 30000 includes a memory device 1100, a controller 1200, a modem 5200, a micro 5400, and a user interface 5500, which are electrically connected to a bus 5300.

When the computing system 30000 is a mobile device, a battery 5600 for supplying operation voltages of the computing system 30000 may be additionally provided in the computing system 30000. Although not shown in this figure, the computing system 30000 may further include an application chip set, a camera image processor (CIS), a mobile DRAM, and the like.

The memory device 1100 may be configured substantially identically to that of FIG. 3, and therefore, detailed description of the memory device 1100 will be omitted.

The controller 1200 and the memory device 1100 may constitute a solid state drive/disk (SSD).

The memory device 1100 and the memory controller 1200 may be packaged in various forms. For example, the memory device 1100 and the memory controller 1200 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), wafer-level processed stack package (WSP) and the like.

According to the present disclosure, the controller may reduce the time required to initialize the page buffer unit included in the memory device, and thus the operation time of the page buffer unit can be reduced by the time required to initialize the page buffer unit in a read operation of the memory system. Also, the initialization operation of the page buffer unit is separated from the read operation in which the page buffer unit substantially operates, so that the current consumption of the page buffer unit may be reduced. Accordingly, it is possible to prevent a peak current of the page buffer unit from being increased. Thus, it is possible to improve the reliability of the memory system.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory cell array including a plurality of memory cells storing data;
a page buffer unit configured to include at least one latch storing data read from the plurality of memory cells or to be programmed to the plurality of memory cells, and to be coupled via at least one bit line; and
a control logic configured to generate a plurality of control signals for initializing the at least one latch according to a period where an address for an operation to be performed is inputted,
wherein the control logic comprises:
a status data generation unit configured to output a plurality of status data according to the address selecting selected memory cells of the plurality of memory cells for operating the operation and a command corresponding to the operation;
an enable signal generation unit configured to output an enable signal according to the command corresponding to the operation and a predetermined initialization mode; and
a control signal generation unit configured to output the plurality of control signals for initializing the at least one latch included in the page buffer unit according to the plurality of status data and the enable signal.

2. The memory device of claim 1, wherein the plurality of control signals include a precharge signal precharging a sensing node connected to the at least one bit line, a setup signal setting up the at least one latch or a reset signal resetting the at least one latch.

3. The memory device of claim 1, wherein the command corresponding to the operation is an address input command or an address input completion command.

4. The memory device of claim 3, wherein the address is inputted to the memory device from entering the address input command to entering the address input completion command.

5. The memory device of claim 4, wherein the memory device initializes the at least one latch from entering the address input command to entering the address input completion command.

6. The memory device of claim 1, wherein the status data generation unit outputs the plurality of status data according to a delayed write enable signal for entering the command corresponding to the operation, the address and the data, and a delayed address latch enable signal for showing an address entering the memory device.

7. The memory device of claim 4, wherein the predetermined initialization mode shows that the at least one latch will be initialized with a signal transformed from a low level to a high level before entering the address input command.

8. The memory device of claim 7, wherein the enable signal generation unit outputs the enable signal generated by a first signal, transformed from a low level to a high level or from a high level to a low level when the address input command or the address input completion command is entered and by a second signal transformed from a low level to a high level before entering the address input command.

9. The memory device of claim 8, wherein the control signal generation unit comprises a data signal generation unit outputting a precharge generation signal, a setup generation signal and a reset generation signal according to the plurality of status data and the enable signal.

10. The memory device of claim 9, wherein the control signal generation unit outputs the precharge signal, the setup signal or the reset signal according to the plurality of status data and the enable signal.

11. The memory device of claim 10, wherein the precharge signal is transformed from a low level to a high level or from a high level to a low level when a first address of the address is entered or a final address of the address is entered.

12. The memory device of claim 10, wherein the setup signal or the reset signal is transformed from a low level to a high level or from a high level to a low level when one of the plurality of status data is entered or one of the plurality of status data is entered completely.

13. A method of operating a memory device, the method comprising:
receiving a command corresponding to an operation;
receiving an address selecting selected memory cells of a plurality of memory cells included in the memory device for operating the operation;
generating a plurality of status data according to the command corresponding to the operation and the address;
generating an enable signal according to the command corresponding to the operation and a predetermined initialization mode; and
initializing at least one latch included in a page buffer unit -according to the plurality of status data and the enable signal,
wherein generating the plurality of status data comprises:
delaying a write enable signal for receiving the command corresponding to the operation, the plurality of addresses and data;
delaying an address latch enable signal referring to the plurality of addresses as an address; and
generating the plurality of status data according to the delayed signals.

14. The method of claim 13, wherein receiving the command corresponding to the operation comprises:
receiving an address input command or an address input completion command.

15. The method of claim 14, wherein receiving the address comprises:
receiving the address from receiving the address input command to receiving the address input completion command.

16. The method of claim 13, wherein generating the plurality of status data comprises:
generating a first signal transformed from a low level to a high level or from a high level to a low level when the address input command or the address input completion command is received; and
generating a second signal transformed from a low level to a high level before receiving the address input command.

17. The method of claim 13, wherein initializing the at least one latch comprises:
generating a plurality of control data according to the plurality of status data and the enable signal.

18. The method of claim 17, wherein initializing the at least one latch comprises:
generating a precharge signal precharging a sensing node connected to at least one bit line according to the plurality of control data;
generating a setup signal setting up the at least one latch or a reset signal resetting the at least one latch according to the plurality of control data.

19. A memory system comprising:
a memory device including a plurality of memory cells storing data; and
a controller configured to output a plurality of control signals for controlling the memory device,
wherein when an address selecting selected memory cells of the plurality of memory cells for operating an operation is received by the memory device, at least one latch of the memory device is initialized according to a plurality of status data, corresponding to a command for operating the operation and the address, and an enable signal generated by the command and a predetermined initialization mode, and
wherein the plurality of status data are generated according to a delayed write enable signal for receiving the command corresponding to the operation, the plurality of addresses and data, and an delayed address latch enable signal referring to the plurality of addresses as an address.

* * * * *